United States Patent
Numata

(10) Patent No.: US 7,265,984 B2
(45) Date of Patent: Sep. 4, 2007

(54) HEAT DISSIPATION DEVICE FOR ELECTRONIC EQUIPMENT

(75) Inventor: Takehiko Numata, Hidaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/357,973

(22) Filed: Feb. 22, 2006

(65) Prior Publication Data

US 2006/0187645 A1    Aug. 24, 2006

(30) Foreign Application Priority Data

Feb. 23, 2005   (JP)   ............ 2005-047439

(51) Int. Cl.
   *H05K 7/20*   (2006.01)
   *H05K 9/00*   (2006.01)
(52) U.S. Cl. ............ 361/719; 361/704; 361/709; 361/800; 361/816; 361/818; 165/104.33
(58) Field of Classification Search ........ 361/704, 361/707, 714, 719, 800, 816, 818; 165/80.3, 165/185
   See application file for complete search history.

(56) References Cited

U.S. PATENT DOCUMENTS

| | | | |
|---|---|---|---|
| 5,060,114 A | 10/1991 | Feinberg et al. | |
| 5,384,940 A | 1/1995 | Soule et al. | |
| 5,566,052 A * | 10/1996 | Hughes | 361/704 |
| 5,581,443 A | 12/1996 | Nakamura et al. | |
| 5,604,665 A | 2/1997 | Chrysler et al. | |
| 5,784,256 A | 7/1998 | Nakamura et al. | |
| 6,025,991 A * | 2/2000 | Saito | 361/704 |
| 6,357,514 B1 * | 3/2002 | Sasaki et al. | 165/80.3 |
| 6,445,583 B1 * | 9/2002 | Kline et al. | 361/704 |
| 6,545,871 B1 * | 4/2003 | Ramspacher et al. | 361/709 |
| 6,673,998 B1 * | 1/2004 | Wu | 174/383 |
| 7,061,773 B2 * | 6/2006 | Chen | 361/816 |
| 2002/0154487 A1 * | 10/2002 | Weischhof fVan Rijn | 361/719 |
| 2004/0190206 A1 | 9/2004 | Ookawa et al. | |
| 2004/0190260 A1 * | 9/2004 | Sasaki | 361/704 |
| 2006/0176672 A1 * | 8/2006 | Kamemoto et al. | 361/714 |
| 2006/0187643 A1 * | 8/2006 | Tsurufusa | 361/704 |

FOREIGN PATENT DOCUMENTS

| | | | |
|---|---|---|---|
| JP | 7-30280 | | 1/1995 |
| JP | 7-226466 | | 8/1995 |
| JP | 08279689 A | * | 10/1996 |
| JP | 9-64582 | | 3/1997 |
| JP | 2002190684 A | * | 7/2002 |
| JP | 2002-359380 | | 12/2002 |
| JP | 2002368481 A | * | 12/2002 |

* cited by examiner

*Primary Examiner*—Jayprakash Gandhi
*Assistant Examiner*—Robert J. Hoffberg
(74) *Attorney, Agent, or Firm*—Finnegan, Henderson, Farabow, Garrett & Dunner, L.L.P.

(57) ABSTRACT

A heat sink is attached to fixing plates of a shield case. When a circuit board is covered by the shield case, the heat sink comes into contact with a circuit component mounted on the circuit board through a heat conduction sheet. Further, clearance holes, which are approximately closed by first heat dissipation plates, are formed to the shield case.

9 Claims, 7 Drawing Sheets

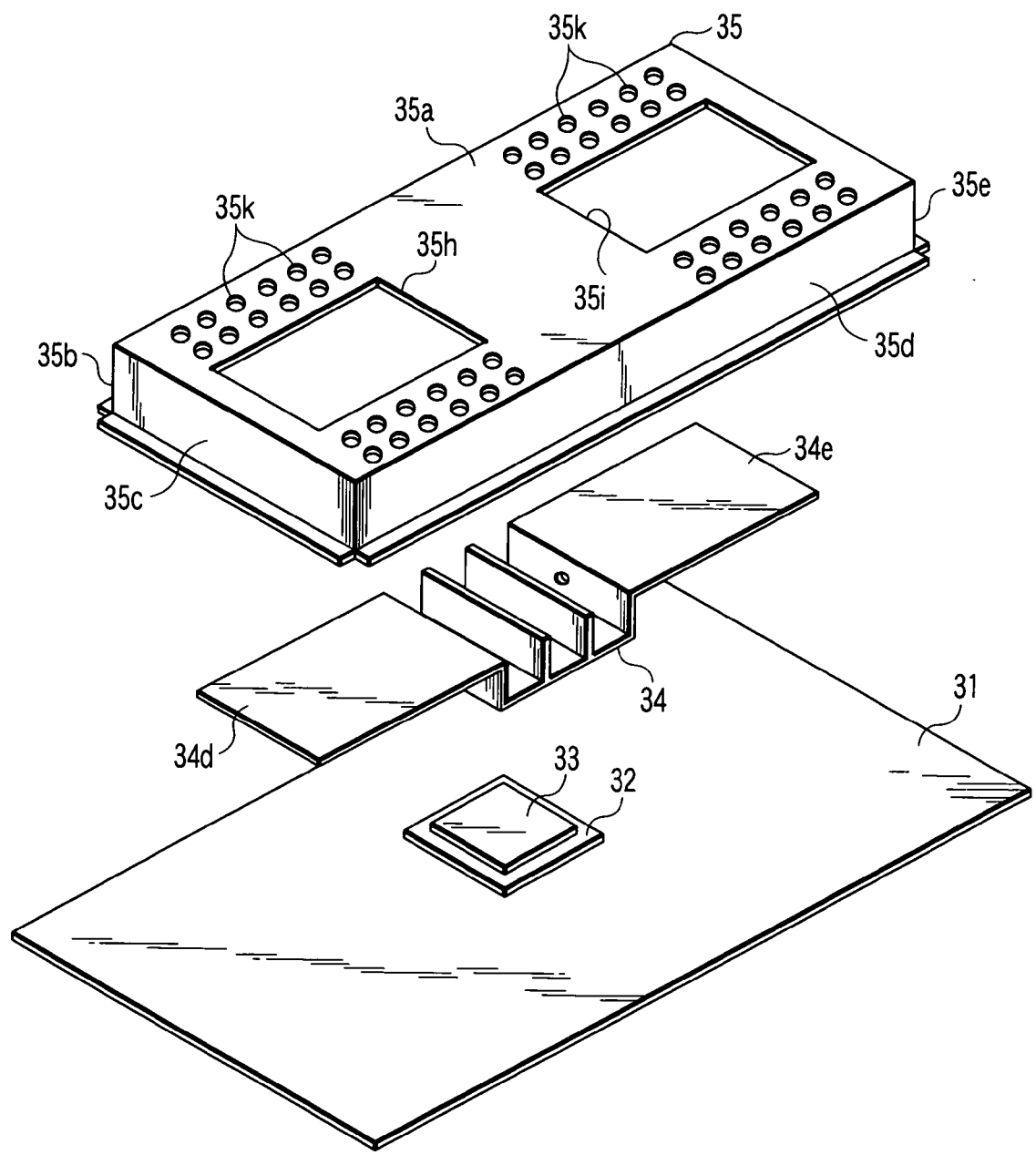
F I G. 2

HEAT DISSIPATION DEVICE FOR ELECTRONIC EQUIPMENT

CROSS-REFERENCE TO RELATED APPLICATIONS

This application is based upon and claims the benefit of priority from prior Japanese Patent Application No. 2005-047439, filed Feb. 23, 2005, the entire contents of which are incorporated herein by reference.

BACKGROUND OF THE INVENTION

1. Field of the Invention

The present invention relates to electronic equipment, for example, a digital television broadcasting receiver and the like, and a more particularly, to an improvement of a heat dissipation device for dissipating heat from heat generating circuit components.

2. Description of the Related Art

As known well, in recent years, digitalization of television broadcasting is promoted. For example, in Japan, ground digital broadcasting starts in addition to satellite digital broadcasting such as BS (broadcasting satellite) digital broadcasting, 110° CS (communication satellite) digital broadcasting, and the like.

In digital broadcasting receivers for receiving such digital television broadcasting, since it is required to process, in particular, digital video data at high speed, a circuit component such as an LSI (large scale integration) and the like that execute the high speed processing generates heat. Thus, it is vital to employ a countermeasure for dissipated heat.

Jpn. Pat. Appln. KOKAI Publication No. 9-64582 discloses an arrangement that a hole is formed in a flat surface of a shield case that is parallel to the surface of a circuit board, and a metal distinct piece is attached to the peripheral edge portion of the hole so as to come into contact with a heat generating component mounted on the circuit board. In this case, the metal distinct piece is attached to the shield case in such a manner that the peripheral edge portion of the hole is clamped in the direction of thickness by a pair of projections projecting from the metal distinct piece in parallel to the flat surface of the shield case.

U.S. Pat. No. 6,445,583 also discloses an arrangement that a hole is formed to a flat surface parallel to a surface of a circuit board of a shield case and a lid member, which comes into contact with a heat generating component mounted on the circuit board, is attached to the peripheral edge portion of the hole. In this case, the lid member is attached to the peripheral edge portion of the hole by a cam structure using elastic force.

U.S. Pat. No. 5,060,114 discloses an arrangement that a heat generating component is caused to come into contact with a heat sink acting also as a shield case through a flexible gel-like pad. In this case, the heat sink is caused to come into pressure contact with the heat generating component by the elastic force generated by the heat sink itself. Jpn. Pat. Appln. KOKAI Publication No. 2002-359380 and U.S. Pat. No. 5,384,940 disclose an arrangement that a heat dissipating member is caused to come into pressure contact with a heat generating component by a leaf spring or a coil spring.

BRIEF SUMMARY OF THE INVENTION

According to one aspect of the present invention, there is provided a heat dissipation device for electronic equipment comprising: a circuit board on which a circuit component is mounted; a heat conduction sheet attached to the circuit component; a heat sink coming into contact with the heat conduction sheet and having first heat dissipation plates disposed in parallel to the circuit board; and a shield case which covers the surface of the circuit board including the heat sink, the shield case having a flat plate including clearance holes, which are formed thereto in the portions confronting the first heat dissipation plates the heat sink and approximately closed by the first heat dissipation plates, and attaching the heat sink to fixing plates projecting from the positions of the flat plate confronting the heat sink toward the circuit board.

BRIEF DESCRIPTION OF THE SEVERAL VIEWS OF THE DRAWING

FIG. 2 is an exploded perspective view explaining a circuit board on which the video signal processing system in the embodiment is arranged and structures of a heat sink and a shield case;

DETAILED DESCRIPTION OF THE INVENTION

Figure 1:
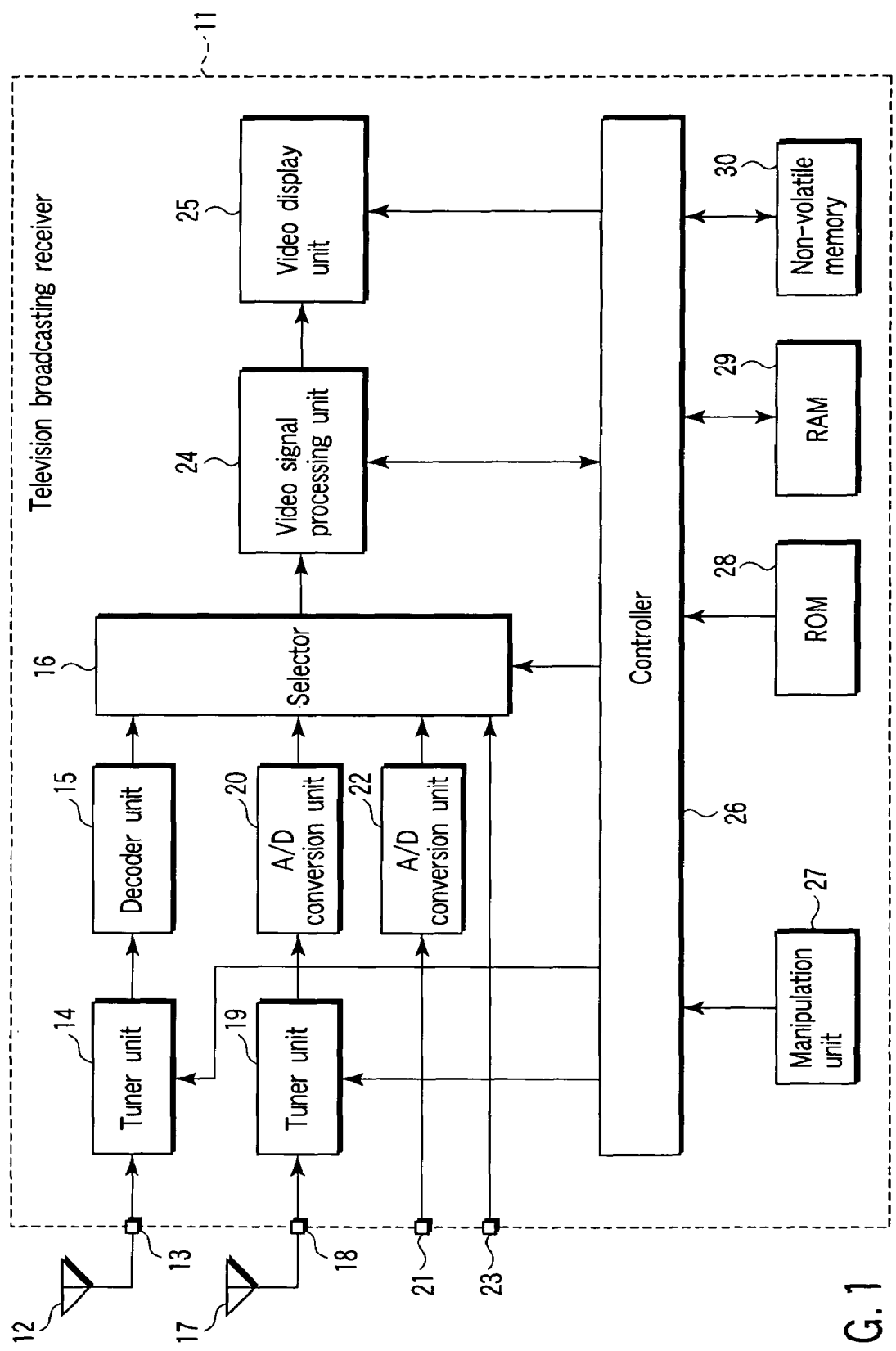
FIG. 1 is a block arrangement view that shows an embodiment of the present invention and explains a video signal processing system of a television broadcasting receiver.

An embodiment of the present invention will be explained below in detail with reference to the drawings. FIG. 1 schematically shows a video signal processing system of a television broadcasting receiver 11 explained in the embodiment. More specifically, a digital television broadcasting signal received by an antenna 12 for receiving digital television broadcasting is supplied to a tuner unit 14 through an input terminal 13.

The tuner unit 14 selects and demodulates the signal of a desired channel from the digital television broadcasting signal input thereto. The signal output from the tuner unit 14 is supplied to a decoder unit 15, subjected to, for example, MPEG (moving picture experts group) 2 decode processing therein, and then supplied to a selector 16.

Further, an analog television broadcasting signal received by an antenna 17 for receiving analog television broadcasting is supplied to a tuner unit 19 through an input terminal 18. The tuner 19 selects and demodulates the signal of a desired channel from the analog television broadcasting signal input thereto. The signal output from the tuner unit 19 is output to the selector 16 after it is digitized by an A/D (analog/digital) conversion unit 20.

Further, an analog video signal supplied to an external input terminal 21 for analog video signal is output to the selector 16 after it is supplied to an A/D conversion unit 22 to be digitized. Further, a digital video signal supplied to an external input terminal 23 for digital video signal is supplied to the selector 16 as it is.

The selector 16 selects one of the four types of digital video signals input thereto and supplies it to a video signal processing unit 24. The video signal processing unit 24 subjects the digital video signal input thereto to predetermined signal processing so that it is displayed on a video display unit 25. Employed as the video display unit 25 is a flat panel display composed of, for example, a liquid crystal display, a plasma display, and the like.

In the television broadcasting receiver 11, various types of operations including the various types of the signal receiving operations described above are integrally controlled by a controller 26. The controller 26 is composing a microprocessor including a CPU (central processing unit) and controls the respective units in response to manipulation information from a manipulation unit 27 including a remote controller (not shown) and the like so that the manipulation contents of the manipulation information are reflected.

In this case, the controller 26 mainly makes use of a ROM (read only memory) 28 in which a control program to be executed by the CPU is stored, a RAM (random access memory) 29 for providing the CPU with a working area, and a non-volatile memory 30 in which various types of setting information, control information, and the like are stored.

FIG. 2 shows a circuit board 31 on which the video signal processing system of the television broadcasting receiver 11 is arranged. That is, various types of circuit components, circuit patterns, and the like for constituting the video signal processing system are mounted on circuit board 31. A countermeasure for heat dissipation is required to, in particular, an LSI 32 constituting the decoder unit 15 in the various types of the circuit components mounted on the circuit board 31 because the LSI 32 generates heat when it processes digital data at high speed.

As the countermeasure for heat dissipation, a heat sink 34 is caused to come into intimate contact with the surface of the LSI 32, which is formed in an approximately square flat shape, located opposite to the surface thereof confronting the circuit board 31 through a flexible heat conduction sheet 33. Then, various types of circuit components are electromagnetically shielded by covering the surface of the circuit board 31, on which the LSI 32 is mounted, by a shield case 35 together with the heat sink 34.

Figure 3:
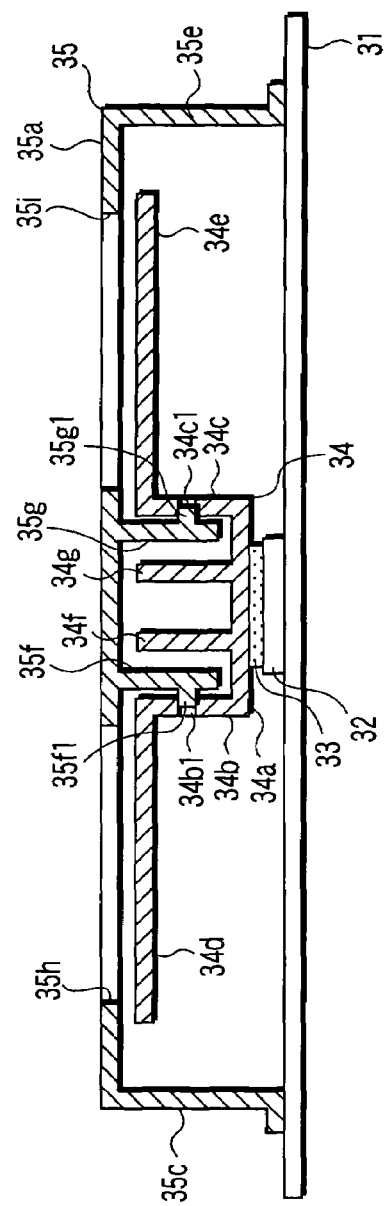
FIG. 3 is a side sectional view explaining an attachment structure of the heat sink and the shield case in the embodiment.

FIG. 3 shows an attachment structure of the heat sink 34. The heat sink 34 is composed of a base plate 34a that is formed in an approximately square shape, disposed parallel to the circuit board 31, and in contact with the heat conduction sheet 33, a pair of side plates 34b and 34c extending from both confronting ends of the base plate 34a vertically in the same direction with respect to the surface of the base plate 34a, respectively, (first) heat dissipation plates 34d and 34e extending externally from the apical ends of the side plates 34b and 34c in parallel to the base plate 34a, respectively, and a plurality (two pieces in the illustrated example) of (second) heat dissipation plates 34f and 34g projecting from predetermined positions of the base plate 34a in parallel to the side plates 34b and 34c, and these members are formed integrally by extrusion molding, for example, a metal material and the like having a heat conduction property.

Locking holes 34b1 and 34c1 are formed to predetermined positions confronting each other of the pair of side plates 34b and 34c of the heat sink 34. Further, the heat dissipation plates 34d and 34e have predetermined sizes (surface areas) that are previously designed to sufficiently obtain a heat dissipation effect to the amount of heat generated by the LSI 32.

Further, the shield case 35 is composed of a flat plate 35a formed in an approximately square flat shape, four side plates 35b, 35c, 35d, and 35e extending from the four peripheral edge portions of the flat plate 35a in the same direction vertically with respect to the surface of the flat plate 35a, respectively, and two fixing plates 35f and 35g projecting from predetermined positions of the flat plate 35a so as to respectively confront the surfaces of side plates 34b and 34c of the heat sink 34, and these members are formed integrally with each other by extrusion molding, for example, a metal material and the like.

The shield case 35 covers various types of circuit components mounted on the circuit board 31 by being attached to the circuit board 31 such that the opening end thereof formed by the respective side plates 35b, 35c, 35d, and 35e come into contact with the surface of the circuit board 31.

Further, projecting portions 35f1 and 35g1, which can be engaged with the locking holes 34b1 and 34c1 formed to the side plates 34b and 34c, are formed to the respective fixing plates 35f and 35g of the shield case 35.

Accordingly, the heat sink 34 can be combined integrally with the shield case 35 by engaging the projecting portions 35f1 and 35g1 formed to the fixing plates 35f and 35g of the shield case 35 with the locking holes 34b1 and 34c1 formed to the side plates 34b and 34c of the heat sink 34, respectively. The base plate 34a of the heat sink 34 is caused to come into intimate contact with the heat conduction sheet 33 at predetermined pressure by attaching the shield case 35 to the circuit board 31 in this state, thereby a heat dissipation structure is completed.

When the shield case 35 is attached to the circuit board 31 as described above, the heat dissipation plates 34d and 34e of the heat sink 34 confront the surface of the flat plate 35a of the shield case 35 in the vicinity thereof. Clearance holes 35h and 35i having a size approximately closed by the heat dissipation plates 34d and 34e are formed to the flat plate 35a of the shield case 35 at the positions thereof that confront the surfaces of the heat dissipation plates 34d and 34e. With this arrangement, since the heat dissipation plates 34d and 34e are exposed to the outside of the shield case 35 through the clearance holes 35h and 35i, the heat dissipation effect can be enhanced.

According to the embodiment described above, when the shield case 35 is combined integrally with the heat sink 34 and the shield case 35 is attached to the circuit board 31, the heat sink 34 comes into intimate contact with the heat conduction sheet 33. Therefore, an arrangement for causing the heat sink 34 to come into pressure contact with the LSI 32 using a leaf spring, a coil spring, and the like is not necessary, thereby the heat dissipation effect can be sufficiently obtained by a simple arrangement.

Further, since the clearance holes 35h and 35i having the size approximately closed by the heat dissipation plates 34d and 34e of the heat sink 34 are formed to the flat plate 35a of the shield case 35 to thereby expose the heat dissipation plates 34d and 34e to the outside of the shield case 35, the heat dissipation effect can be enhanced by a simple arrangement without sacrificing a shield effect.

Further, since the projecting portions 35f1 and 35g1 of the fixing plates 35f and 35g projecting vertically from the flat plate 35a of the shield case 35 are engaged with the locking holes 34b1 and 34c1 formed to the side plates 34b and 34c of the heat sink 34, a member for attaching the heat sink 34 to the shield case 35 does not project externally from the flat plate 35a of the shield case 35, which also contributes to simplify and miniaturize the arrangement.

Note that although the locking holes 34b1 and 34c1 are formed to the side plates 34b and 34c of the heat sink 34 and the projecting portions 35f1 and 35g1 are formed to the fixing plates 35f and 35g of the shield case 35 in the embodiment described above, the present invention is by no means limited thereto, and it is needless to say that the projecting portions may be formed to the side plates 34b and 34c of the heat sink 34 and the locking holes may be formed to the fixing plates 35f and 35g of the shield case 35.

It is also needless to say that the locking holes 34b1 and 34c1 need not be holes passing through the side plates 34b and 34c and may be recessed portions with which the projecting portions 35f1 and 35g1 can be engaged.

Figure 4:
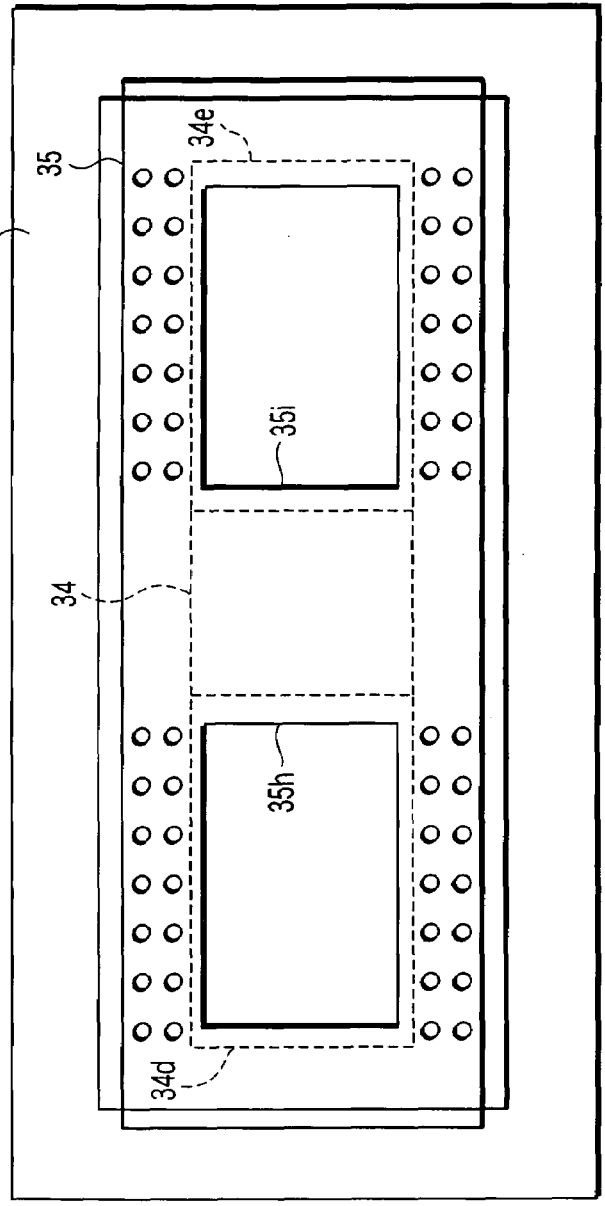
FIG. 4 is a plan view showing a relation between the heat sink and the shield case in the embodiment.

Further, as shown in FIG. 4, when the size of the clearance holes 35h and 35i formed in the flat plate 35a of the shield case 35 is made slightly smaller than the size of the heat dissipation plates 34d and 34e of the heat sink 34 and portions that overlap the heat dissipation plates 34d and 34e are formed in the peripheral edge portions of the clearance holes 35h and 35i, the overlapping portions act as capacitors, and the flat plate 35a is connected to the heat dissipation plates 34d and 34e through an alternate current path, which prevents the shield effect from being sacrificed.

Note that, as the size of the clearance holes 35h and 35i, a size by which a sufficient air flow can be obtained is selected in consideration of at least the viscosity of air in order to dissipate the heat generated by the LSI 32. To explain specifically, as shown in FIG. 2, a plurality of small holes 35k are ordinarily formed to the shield case 35 so that the circuit board 31 can be visually observed even after the shield case 35 is attached thereto. The small holes 35k are formed in such a size that it does not sacrifice the shield effect and the inside of the shield case 35 can be visually observed therethrough.

However, the air flow cannot be sufficiently generated by the small holes 35k having the size due to the viscosity of air, and thus a practically usable heat dissipation effect cannot be obtained thereby.

To cope with the above problem, the clearance holes 35h and 35i whose size is set such that the air flow can be sufficiently obtained without being affected by the viscosity of air are formed and approximately closed by the heat dissipation plates 34d and 34e of the heat sink 34 so that the heat dissipation effect that is sufficient in a practical use can be obtained without sacrificing the shield effect.

Figure 5:
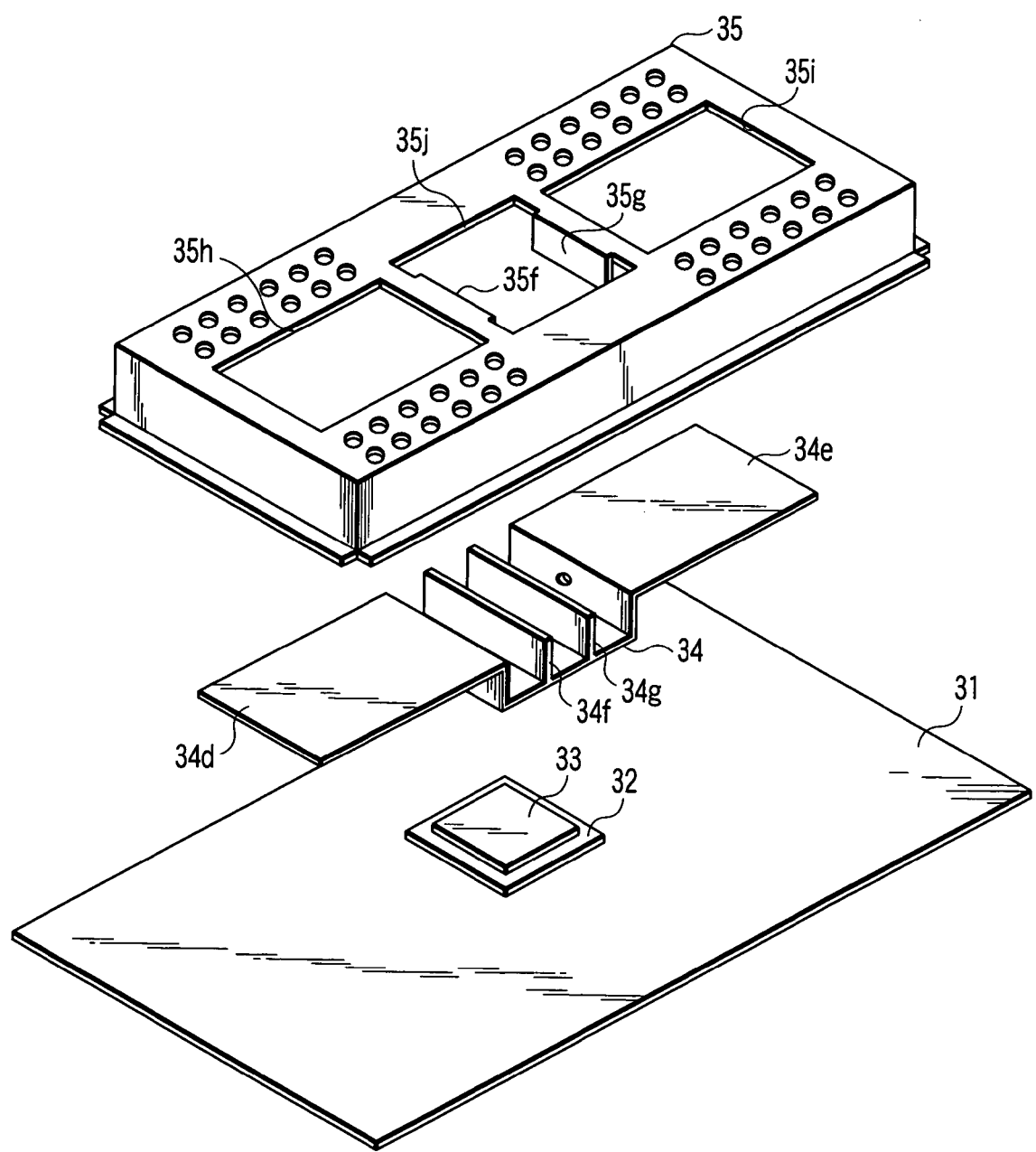
FIG. 5 is an exploded perspective view shown to explain a modification of the structure of the shield case in the embodiment.

Further, as shown in FIG. 5, a cutout portion 35j may be formed to the flat plate 35a of the shield case 35 in the portion corresponding to the base plate 34a of the heat sink 34 while the fixing plates 35f and 35g may be formed by bending the remaining part of the flat plate 35a vertically. With this arrangement, since the heat dissipation plates 34f and 34g of the heat sink 34 are exposed to the outside through the cutout portion 35j, the heat dissipation effect can be enhanced.

Figure 6:
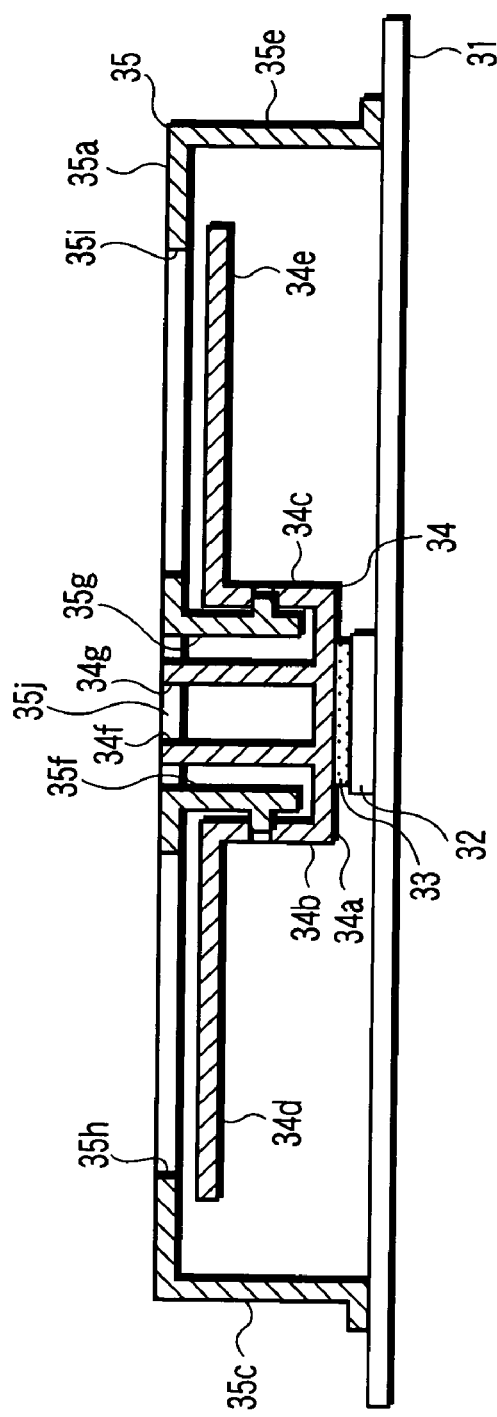
FIG. 6 is a side sectional view shown to explain a modification of a structure of a heat dissipation plate of the heat sink in the embodiment.

When the cutout portion 35j is formed to the flat plate 35a of the shield case 35 at the portion corresponding to the base plate 34a of the heat sink 34, the height of the heat dissipation plates 34f and 34g projecting from the base plate 34a of the heat sink 34 is set such that the apical ends thereof do not project to the outside of the flat plate 35a of the shield case 35 passing through the cutout portion 35j as shown in FIG. 6.

With this arrangement, since the thickness of a circuit module including the circuit board 31 and the shield case 35 can be reduced, it can be preferably applied to the thin television broadcasting receiver 11 employing a flat panel display as the video display unit 25.

Figure 7:
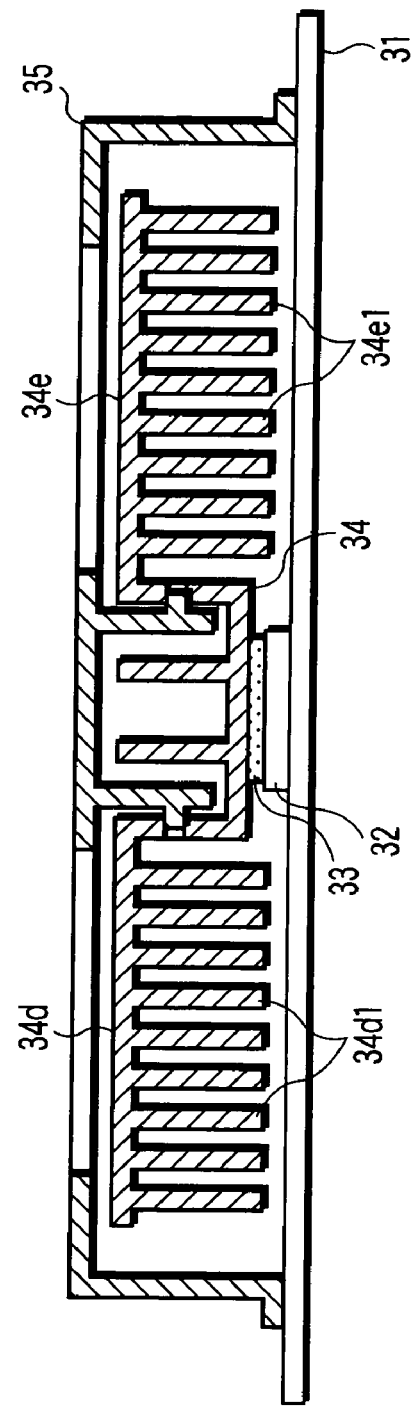
FIG. 7 is a side sectional view shown to explain another modification of the heat dissipation plate of the heat sink in the embodiment.

FIG. 7 shows a modification of the heat sink 34. When explanation is made with reference to FIG. 7 in which the same components as those in FIG. 3 are denoted by the same reference numerals, a plurality of heat dissipation fins 34d1 and 34e1 are formed to the heat dissipation plates 34d and 34e of the heat sink 34 that is disposed parallel to the circuit board 31 when the heat sink 34 is attached to the shield case 35 in such a manner that the heat dissipation fins 34d1 and 34e1 project from the surface of the heat dissipation plates 34d and 34e toward the circuit board 31 in parallel with each other. With this arrangement, a heat dissipation area can be easily increased in the shield case 35, thereby the heat dissipation effect can be more enhanced without sacrificing the shield effect.

Figure 8:
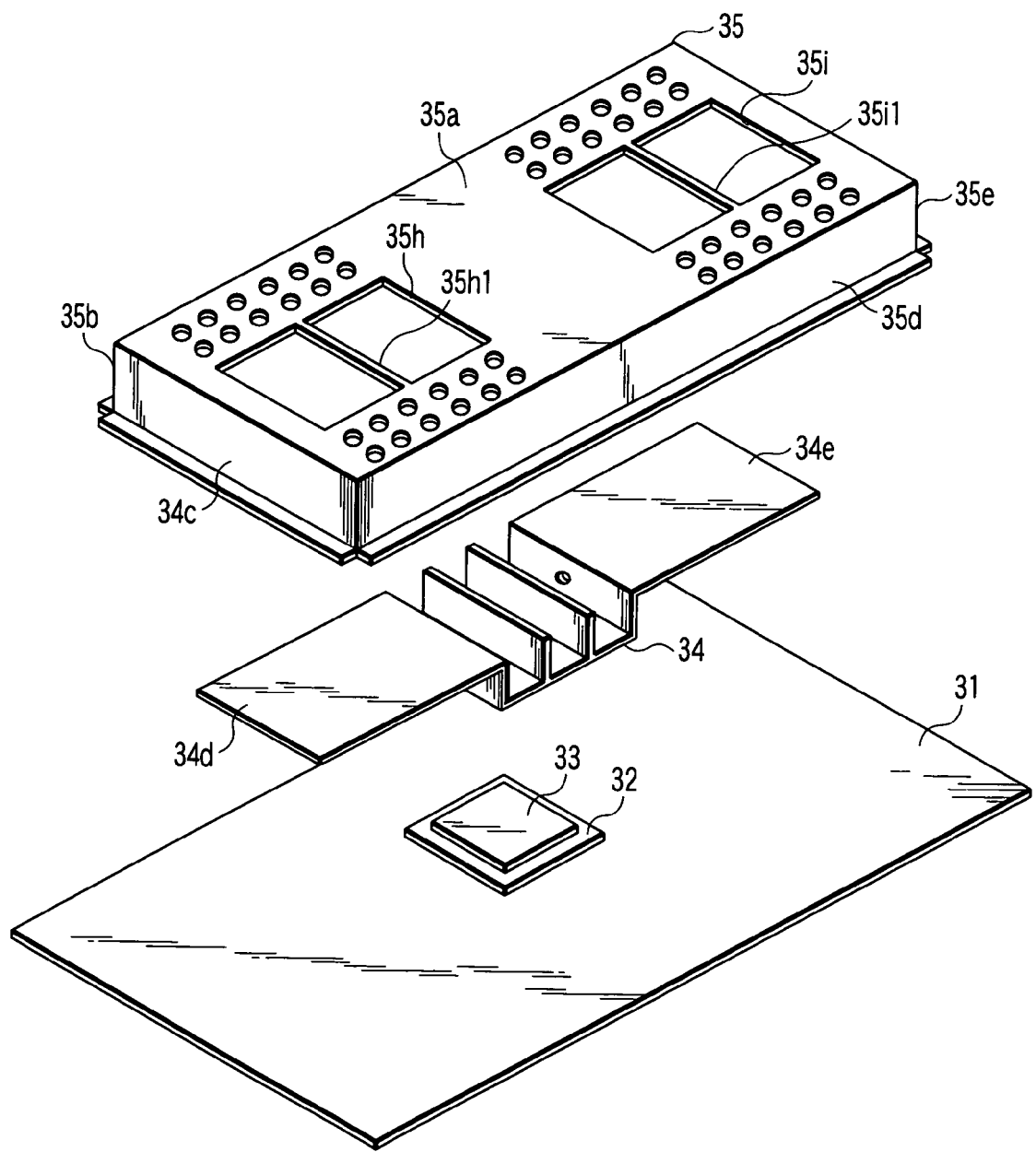
FIG. 8 is an exploded perspective view shown to explain another modification of the shield case in the embodiment.

FIG. 8 shows a modification of the shield case 35. When explanation is made with reference to FIG. 8 in which the same components as those in FIG. 2 are denoted by the same reference numerals, reinforcement frames 35h1 and 35i1 are formed in clearance holes 35h and 35i formed in the flat plate 35a of the shield case 35 so as to connect approximately the central portions of both confronting sides of the clearance holes 35h and 35i. With this arrangement, even if the clearance holes 35h and 35i are formed in a large size, the shield case 35 can be prevented from being deformed by heat as much as possible. With this arrangement, the shield effect can be prevented from being sacrificed due to a gap.

Figure 9:
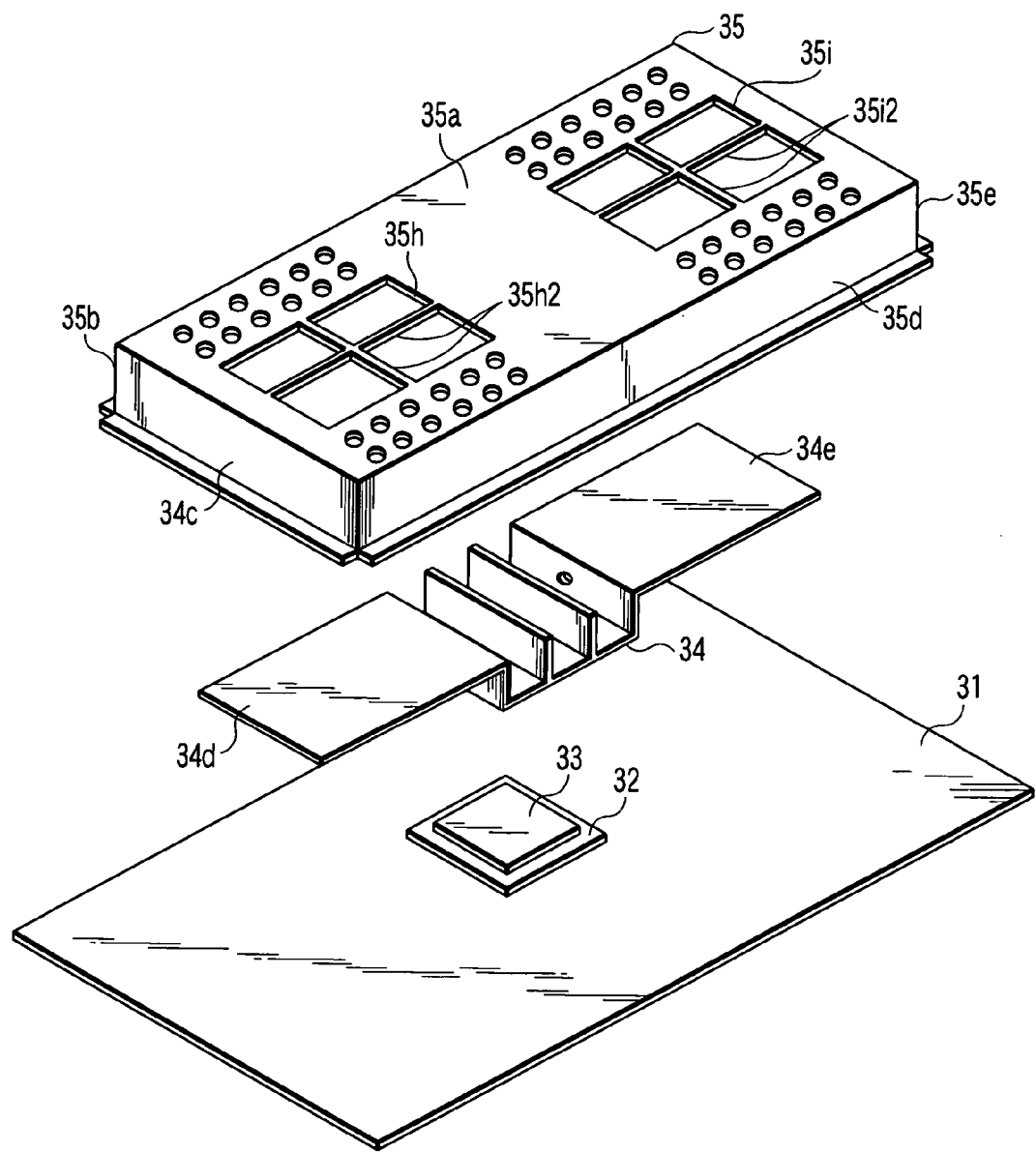
FIG. 9 is an exploded perspective view explaining still another modification of the shield case in the embodiment.

Further, as shown in FIG. 9, reinforcement frames 35h2 and 35i2 may be formed to partition the clearance holes 35h and 35i of the shield case 35 in a cross-shape. In short, the reinforcement frames may be appropriately designed according to required strength.

Note that the present invention is by no means limited to the embodiments described above and can be embodied by modifying the components within the scope that does not depart from the gist of the invention at a practical phase. Further, various types of inventions can be accomplished by appropriately combining the plurality of components disclosed in the embodiments. For example, several components may be eliminated from all the components shown in the embodiments. Further, the components according to the different embodiments may be appropriately combined with each other.

What is claimed is:

1. A heat dissipation device for electronic equipment, comprising:
   a circuit board on which a circuit component is mounted;
   a heat conduction sheet attached to the circuit component;
   a heat sink coming into contact with the heat conduction sheet and having first heat dissipation plates disposed in parallel to the circuit board; and
   a shield case configured to cover a surface of the circuit board and the heat sink, the shield case having a flat plate including clearance holes which are formed therein in portions opposing the first heat dissipation plates of the heat sink and approximately closed by the first heat dissipation plates, and attaching the heat sink to fixing plates projecting from the positions of the flat plate corresponding to the heat sink.

2. The heat dissipation device for electronic equipment according to claim 1, wherein the shield case forms the fixing plates by bending a part of the flat plate.

3. The heat dissipation device for electronic equipment according to claim 1, wherein a cutout portion is formed in the flat plate of the shield case to expose the heat sink attached to the fixing plates to the outside.

4. The heat dissipation device for electronic equipment according to claim 1, wherein
the fixing plates include a pair of fixing plates formed approximately parallel to each other,
the heat sink includes a pair of side plates opposing surfaces of the fixing plates, respectively, and
the heat sink is attached to the shield case by engaging recessed portions formed in the respective side plates with projecting portions and formed in the respective fixing plates.

5. The heat dissipation device for electronic equipment according to claim 1, wherein the clearance holes formed in the flat plate of the shield case have such a size that portions overlapping the first heat dissipation plates are formed in peripheral edge portions thereof.

6. The heat dissipation device for electronic equipment according to claim 1, wherein the first heat dissipation plates of the heat sink have a plurality of heat dissipation fins which project from surfaces thereof toward the circuit board.

7. The heat dissipation device for electronic equipment according to claim 1, wherein
a cutout portion is formed in the flat plate of the shield case at the portion corresponding to the heat sink attached to the fixing plates to expose the heat sink to the outside, and
second heat dissipation plates project from the heat sink such that they do not project to the outside of the flat plate of the shield case.

8. A heat dissipation device for electronic equipment, comprising:
a flat-shaped circuit board;
a flat-shaped circuit component mounted on the circuit board such that a first surface of the circuit component opposes a surface of the circuit board;
a heat conduction sheet composed of a flexible material and attached to a second surface of the circuit component opposite to the first surface thereof;
a heat sink formed integrally of a base plate in contact with the heat conduction sheet in parallel to the circuit board, first side plates extending vertically from ends of the base plate with respect to a surface of the base plate, and first heat dissipation plates extending from ends of the first side plates in parallel to the base plate; and
a shield case configured to cover the circuit board and the heat sink, the shield case being formed integrally of a flat plate disposed approximately parallel to the surface of the circuit board and having clearance holes formed therein in a portion opposing the first heat dissipation plates of the heat sink and approximately closed by the first heat dissipation plates, second side plates extending from peripheral edge portions of the flat plate, and fixing plates extending from predetermined positions of the flat plate in a same direction as the second side plates and to which the first side plates of the heat sink are attached.

9. An electronic equipment, comprising:
a receiver unit configured to receive a signal;
a circuit board, on which a circuit component is mounted, configured to subject the signal received by the receiver unit to predetermined processing;
a heat conduction sheet attached to the circuit component;
a heat sink coming into contact with the heat conduction sheet and having first heat dissipation plates disposed parallel to the circuit board; and
a shield case configured to cover a surface of the circuit board and the heat sink, the shield case having a flat plate, which is approximately parallel to the surface of the circuit board and includes clearance holes formed in portions opposing the first heat dissipation plates of the heat sink, and having approximately a same size as the first heat dissipation plates, and attaching the heat sink to fixing plates extending from the position of the flat plate corresponding to the heat sink.

* * * * *